(12) United States Patent
Sim et al.

(10) Patent No.: US 8,711,641 B2
(45) Date of Patent: Apr. 29, 2014

(54) MEMORY DEVICE, TEST OPERATION METHOD THEREOF, AND SYSTEM INCLUDING THE SAME

(75) Inventors: Soung Hoon Sim, Yongin-si (KR); Jong Hoon Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 258 days.

(21) Appl. No.: 13/239,111

(22) Filed: Sep. 21, 2011

(65) Prior Publication Data

US 2012/0140576 A1    Jun. 7, 2012

(30) Foreign Application Priority Data

Dec. 1, 2010    (KR) .................. 10-2010-0121524

(51) Int. Cl.
*G11C 7/10*    (2006.01)

(52) U.S. Cl.
USPC .................. 365/189.05; 365/201; 365/205

(58) Field of Classification Search
USPC ............. 365/201, 189.05, 189.07, 189.06, 365/189.08, 189.09, 196, 205, 207, 189.12
See application file for complete search history.

(56) References Cited

U.S. PATENT DOCUMENTS

| | | | |
|---|---|---|---|
| 6,999,365 B2 * | 2/2006 | Takano et al. | 365/207 |
| 7,477,549 B2 | 1/2009 | Honda | |
| 7,495,984 B2 | 2/2009 | Kim et al. | |
| 2009/0073770 A1 * | 3/2009 | Sarin et al. | 365/185.22 |
| 2009/0116290 A1 * | 5/2009 | Yamada | 365/185.17 |
| 2009/0285016 A1 * | 11/2009 | Bedeschi et al. | 365/163 |

FOREIGN PATENT DOCUMENTS

| | | |
|---|---|---|
| JP | 2006-294141 A | 10/2006 |
| JP | 2007-164969 A | 6/2007 |
| JP | 2008-016163 A | 1/2008 |
| KR | 10-2006-0108221 A | 10/2006 |
| KR | 10-2007-0063801 A | 6/2007 |

* cited by examiner

*Primary Examiner* — Son Dinh
*Assistant Examiner* — Hien Nguyen
(74) *Attorney, Agent, or Firm* — Lee & Morse, P.C.

(57) ABSTRACT

A test operation method of a memory device includes a reference current generator generating a reference current and providing a reference voltage generated based on the reference current to one of input terminals of a sense amplifier; providing a read voltage generated based on a read current of a memory cell to another one of the input terminals of the sense amplifier; and the sense amplifier comparing the reference voltage with the read voltage.

9 Claims, 16 Drawing Sheets

MEMORY DEVICE, TEST OPERATION METHOD THEREOF, AND SYSTEM INCLUDING THE SAME

CROSS-REFERENCE TO RELATED APPLICATIONS

Korean Patent Application No. 10-2010-0121524, filed on Dec. 1, 2010, in the Korean Intellectual Property Office, and entitled: "Memory Device, Test Operation Method Thereof, and System Including the Same," is incorporated by reference herein in its entirety.

BACKGROUND

1. Field

Embodiments relate to a memory device, and more particularly, to a memory device including a circuit for measuring a read current of a memory cell, a test operation method of the memory device, and a system including the same.

2. Description of the Related Art

With the rapid development of the miniaturization of processes, variation in basic process parameters increases. The variation in the basic process parameters consequently leads to an increase of variation in transistor parameters and an increase of variation in memory characteristics, such as read current, write margins, and static noise margins.

Recently, a variety of techniques, such as read/write assist, for increasing memory cell reliability have been introduced. However, parametric yield loss has been increased due to the failure of a weak cell having a low read current. The result of measuring the read current of the weak cell using a silicon probe shows a significant deviation from the distribution resulting from memory test element group (TEG) measurement.

This fact indicates that the memory TEG measurement, which is performed on wafer scribe lines, is not statistically significant enough for accurate prediction about millions of memory cells. In addition, the measurement using the silicon probe consumes a lot of time and has low accuracy.

SUMMARY

One or more embodiments provide a memory device configured to quickly and accurately performing weak cell fail analysis, achieving fast yield ramp at an early stage of a process, and improving process monitoring in mass production, a test operation method of the memory device, and a system including the same.

One or more embodiments provide a test operation method of a memory device, the test operation method including generating, by a reference current generator, a reference current and providing a reference voltage generated based on the reference current to a first input terminal of a sense amplifier, providing a read voltage generated based on a read current of a memory cell to a second input terminal of the sense amplifier, and comparing, by the sense amplifier, the reference voltage with the read voltage.

When a level of the read current is less than a level of the reference current, the method may further include counting, by the sense amplifier, the memory cell.

The method may further include changing a level of the reference current and generating a distribution graph of a plurality of memory cells with respect to the levels of the reference current, comparing the distribution graph of the memory cells with respect to the levels of the reference current with a memory cell distribution graph produced using a test element group (TEG), and compensating for an offset of the distribution graph of the memory cells with respect to the level of the reference current.

One or more embodiments provide a memory device, including a memory cell connected to a word line and a plurality of bit lines, a reference current generator configured to generate a reference current, and a sense amplifier configured to perform a test operation by comparing a read voltage generated based on a read current of the memory cell with a reference voltage generated based on the reference current.

The memory device may include a bit line load circuit configured to function as an active resistor to generate the read voltage.

The memory device may include a plurality of column switches respectively connected in series with the plurality of bit lines, and a plurality of sense amplifier switches, wherein first ends of each of the sense amplifier switches are connected to an output terminal of the reference current generator and second ends of each of the sense amplifier switches are connected to input terminals, respectively, of the sense amplifier.

During the test operation, when one of the column switches is turned on, another one of the column switches may be turned off, and when one of the sense amplifier switches is turned on, another one of the sense amplifier switches may be turned off.

The device may include a reference current control circuit configured to perform logic operations on a bit line select signal, a chip select signal, and a test enable signal, and to generate a plurality of sense amplifier switch control signals for respectively controlling the sense amplifier switches, a plurality of column control signals for respectively controlling the column switches, and a reference current control signal for controlling the reference current generator.

When a level of the read current is less than a level of the reference current, the sense amplifier may count the memory cell.

The reference current generator may include a reference voltage pin configured to receive a reference pin voltage and change a level of the reference current, and a reference current pin connected to a test probe to monitor the level of the reference current.

One or more embodiments may provide a memory system, including a memory device, and a processor configured to control the memory device, wherein the memory device includes a memory cell connected to a word line and a plurality of bit lines, a reference current generator configured to generate a reference current, and a sense amplifier configured to perform a test operation by comparing a read voltage generated based on a read current of the memory cell with a reference voltage generated based on the reference current.

The memory device may further include a bit line load circuit configured to function as an active resistor to generate the read voltage.

The memory device may further include a plurality of column switches respectively connected in series with the plurality of bit lines, and a plurality of sense amplifier switches respective one ends of which are connected to an output terminal of the reference current generator and respective other ends of which are connected to input terminals, respectively, of the sense amplifier.

When the read current is less than the reference current, the sense amplifier may count the memory cell.

The reference current generator may include a reference voltage pin configured to receive a reference pin voltage and change a level of the reference current, and a reference current pin connected to a test probe to monitor the level of the reference current.

One or more embodiments provide a memory device, including a plurality of memory cells, a sense amplifier, and a reference current generator including a plurality of transistors coupled in series between a reference current pin and a ground supply, wherein at least one of the transistors is controlled by a reference voltage pin, and the reference current generator is configured to generate a reference current, and to provide a reference voltage generated based on the reference current to the sense amplifier, wherein the sense amplifier is configured to compare the reference voltage with a read voltage generated based on a read current of a respective one of the memory cells.

A level of the reference current may be changed in accordance with a signal supplied by the reference voltage pin.

The bit line load circuit may be configured to function as an active resistor to generate the read voltage.

The bit line load circuit may include a plurality of transistors and each of the plurality of memory cells includes a plurality of transistors and corresponding ones of the plurality of transistors of the memory cells and the bit line load circuit are coupled in series between a supply voltage and a ground supply, and electrical characteristics of the plurality of the corresponding ones of the transistors of the memory cells and the bit line load circuit that are coupled in series are same as electrical characteristics of the plurality of transistors of the reference current generator coupled in series.

The memory device may include a control circuit configured to generate load enable signals, read mux signals, and sense amplifier control signals.

One or more embodiments provide a memory system including one or more features of a memory device described herein and a processor configured to control the memory device.

BRIEF DESCRIPTION OF THE DRAWINGS

Features of embodiments will become more apparent by describing in detail exemplary embodiments thereof with reference to the attached drawings in which.

DETAILED DESCRIPTION

Figure 1:
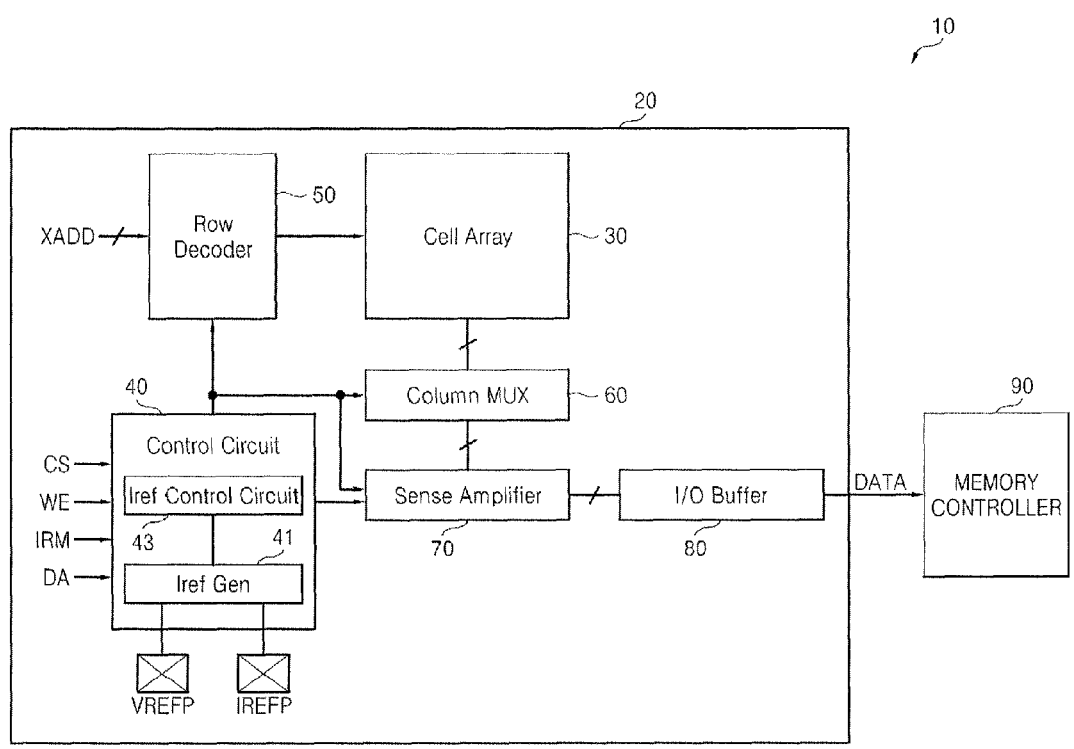
FIG. 1 illustrates a block diagram of an exemplary embodiment of a memory system.

Exemplary embodiments will be described more fully hereinafter with reference to the accompanying drawings, in which embodiments of the invention are shown. Features may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
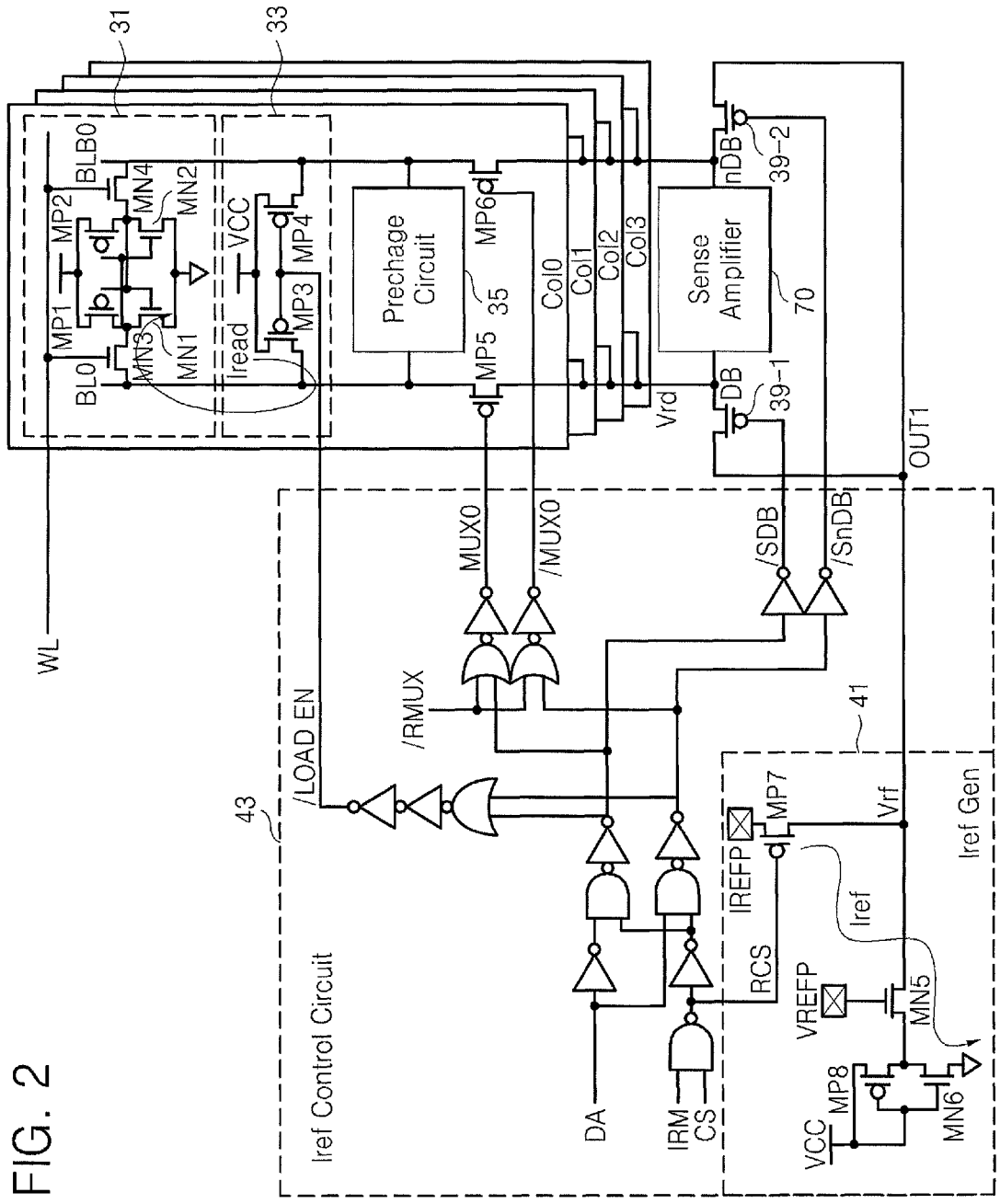
FIG. 2 illustrates a circuit diagram of an exemplary embodiment of a portion of the memory system illustrated in FIG. 1.

FIG. 1 illustrates a block diagram of an exemplary embodiment of a memory system 10. FIG. 2 illustrates a circuit diagram of an exemplary embodiment of a portion of the memory system 10 illustrated in FIG. 1. Referring to FIGS. 1 and 2, the memory system 10 may include a memory device 20 and a memory controller 90.

The memory system 10 may quickly and accurately measure a read current. The memory device 20 may include a cell array 30, a control circuit 40, a row decoder 50, a column multiplexer (MUX) 60, a sense amplifier 70, and an input/output (I/O) buffer 80. The control circuit 40 may include a reference current generator 41 and a reference current control circuit 43.

The memory device 20 may be a volatile or non-volatile memory device. In the following description, for convenience, it is assumed that the memory device 20 is a static random access memory (SRAM).

The cell array 30 may include a plurality of memory cells. Each of the memory cells may be connected to one of a plurality of word lines and one of a plurality of bit lines. The row decoder 50 may decode a row address XADD, and may select one word line from among the plurality of word lines according to a result of the decoding.

For clarity of the description, a single memory cell 31, a single word line WL, and a single pair of bit lines BL0 and BLB0 are illustrated in FIG. 2. The single memory cell 31 may include a plurality of transistors. In the exemplary embodiment of FIG. 2, the memory device 20 is an SRAM, and the memory cell 31 includes six transistors MP1, MP2, MN1, MN2, MN3, MN4.

Referring to FIG. 2, the memory device 20 may include a bit line load circuit 33. the bit line load circuit 33 may function as an active resistor to generate a read voltage Vrd at the bit lines BL0 and BLB0 based on a read current Iread of the memory cell 31 during a test operation for read current measurement.

The bit line load circuit 33 may include a plurality of P-type metal-oxide-semiconductor (PMOS) transistors MP3, MP4. Drains of the respective PMOS transistors MP3, MP4 may be respectively connected to the respective bit lines BL0, BLB0. Sources of the respective PMOS transistors MP3, MP4 may be connected to a supply voltage node VCC.

The PMOS transistors MP3, MP4 may be controlled by a load enable signal /LOAD EN. During a test operation for measuring a read current of each of the memory cells, the load enable signal /LOAD EN may be at a low level. The load enable signal /LOAD EN may be generated by the reference current control circuit 43.

The reference current control circuit 43 may perform a logic operation on a bit line select signal DA, a test enable signal IRM, and a chip select signal CS and may generate the load enable signal /LOAD EN. A plurality of logic gates may be used for the logic operation. In the exemplary embodiment of FIG. 2, when the test enable signal IRM and the chip select signal CS are at a high level, the load enable signal/LOAD EN is generated at the low level.

When data stored in the memory cell 31 is 1, a read current Tread may flow in one of the bit lines BL0, BLB0, i.e., the bit line BL0. When data stored in the memory cell 31 is 0, the read current Iread may flow in the other one of the bit lines BL0, BLB0, i.e., the bit line BLB0. When the read current Iread flows in the bit line load circuit 33, the read voltage Vrd is generated by the bit line load circuit 33.

The memory device 20 may also include a precharge circuit 35. The precharge circuit 35 may provide a precharge voltage to the bit lines BL0, BLB0 during a normal read operation. The normal read operation includes applying the precharge voltage to the bit lines BL0, BLB0, and reading data from the memory cell 31.

The column MUX 60 may select one column from among a plurality of columns Col0, Col1, Col2, Col3 in response to a plurality of control signals (e.g., column control signals MUX0 and /MUX0) output from the control circuit 40 in a read operation. The read operation may be either a normal read operation or a test operation.

The column MUX 60 may include a plurality of column switches (e.g., MP5 and MP6). Each of the column switches MP5 and MP6 may be implemented by a PMOS transistor.

Referring to FIG. 2, the first column switch MP5 and the second column switch MP6 may be controlled he first column control signaby tl MUX0 and the first column control bar signal /MUX0, respectively, to select the first column Col0. The first column control signal MUX0 and the first column control bar signal /MUX0 may be generated by the reference current control circuit 43.

The reference current control circuit 43 may perform a logic operation on the bit line select signal DA, the chip select signal CS, the test enable signal IRM, and a read MUX signal /RMUX, and may generate a plurality of the column control signals MUX0, /MUX0.

The read MUX signal /RMUX may be used to perform a normal read operation. During the normal read operation of the memory device 20, the column control signals MUX0 and /MUX0 are at a low level to select the first column Col0. At this time, the read MUX signal /RMUX is at a low level.

In the test operation of the memory device 20, one of the column control signals MUX0 and /MUX0 is at a high level and the other of the column control signals MUX0 and /MUX0 is at the low level to select one of the bit lines BL0 and BLB0. At this time, the read MUX signal /RMUX is at the low level.

Referring again to FIG. 1, the control circuit 40 may control the row decoder 50, the column MUX 60, the sense amplifier 70, and/or the I/O buffer 80 in response to a control signal, e.g., the chip select signal CS, a write enable signal WE, the test enable signal IRM, or the bit line select signal DA, which may be provided from an external device.

In the exemplary embodiment of FIGS. 1 and 2, the control circuit 40 includes the reference current generator 41 and the reference current control circuit 43.

The reference current generator 41 may generate a reference current Iref for the test operation. The test operation may be a process of measuring the read current of each of the memory cells.

The reference current generator 41 may include a plurality of transistors MP7, MP8, MN5, MN6. The transistors MP7, MN5, MN6 may be connected in series between a reference current pin IREFP and a ground. A source of the eighth PMOS transistor MP8 may be connected to the supply voltage node VCC and a drain thereof may be connected to a source of the fifth N-type metal-oxide-semiconductor (NMOS) transistor MN5. The reference current pin IREFP may be used to monitor the level of the reference current Iref. A test probe (not shown) may be connected to the reference current pin IREFP for the monitoring of the reference current Iref.

The seventh PMOS transistor MP7 may be controlled by a reference-current control signal RCS generated by the reference current control circuit 43. The reference current control circuit 43 may generate the reference-current control signal RCS by performing a logic operation on the test enable signal IRM and the chip select signal CS. The fifth NMOS transistor MN5 of the reference current generator 41 may be controlled by a signal provided from a reference voltage pin VREFP. The signal provided from the reference voltage pin VREFP is a reference pin voltage (not shown).

The reference voltage pin VREFP is used to change the level of the reference current Iref. The level of the reference current Iref may be changed by the signal output from the reference voltage pin VREFP.

The electrical characteristics of the fifth NMOS transistor MN5, the sixth NMOS transistor MN6, the seventh PMOS transistor MP7 included in the reference current generator 41 are the same as those of a plurality of the transistors (e.g., MN3, MN1, MP3) included in the memory cell 31. Accordingly, when the reference current Iref is equal to the read current Iread, a voltage level is the same at a plurality of input terminals DB, nDB of the sense amplifier 70.

The sense amplifier 70 may compare the read voltage Vrd generated based on the read current Iread with a reference voltage Vrf generated based on the reference current Iref during the test operation in which the read current of each of the memory cells may be detected.

The memory device 20 may also include a plurality of sense amplifier switches 39-1, 39-2. One end of each of the sense amplifier switches 39-1, 39-2 may be connected to an output terminal OUT1 of the reference current generator 41 and the other ends of the respective sense amplifier switches 39-1 and 39-2 may be respectively connected to the input terminals DB and nDB of the sense amplifier 70. Each of the sense amplifier switches 39-1, 39-2 may be implemented by a PMOS transistor. The sense amplifier switches 39-1, 39-2 may be controlled by sense amplifier switch control signals /SDB, /SnDB, respectively. The sense amplifier switch control signals /SDB, /SnDB may be generated by the reference current control circuit 43.

The reference current control circuit 43 may generate the sense amplifier switch control signals /SDB, /SnDB by performing a logic operation on the bit line select signal DA, the test enable signal IRM, and the chip select signal CS. The sense amplifier switch control signals /SDB and /SnDB are complementary to each other. For example, when the first sense amplifier switch control signal /SDB is high, the second sense amplifier switch control signal /SnDB is low.

Further, in one or more embodiments, when the first column control signal MUX0 is high and the second column control signal /MUX0 is low for the test operation, the first sense amplifier switch control signal /SDB is low and the second sense amplifier switch control signal /SnDB is high.

Accordingly, when the reference voltage Vrf generated by the reference current Iref is applied to one of the input terminals DB and nDB of the sense amplifier 70, the read voltage Vrd generated based on the read current Iread is applied to the other one of the input terminals DB and nDB of the sense amplifier 70. The sense amplifier 70 may then compare the reference voltage Vrf with the read voltage Vrd.

The sense amplifier 70 may count the memory cell 31 when a level of the read voltage Vrd is lower than a level of the reference voltage Vrf. Data DATA resulting from the test operation may be transmitted to the memory controller 90 through the I/O buffer 80.

Figure 3:
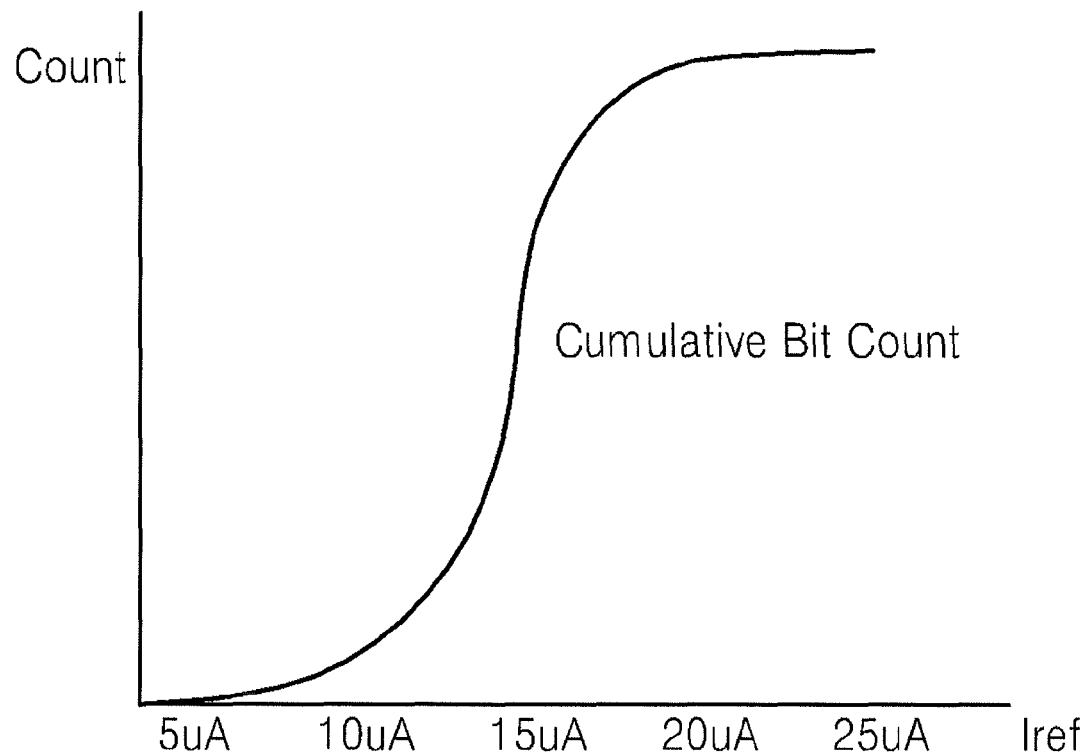
FIG. 3 illustrates a graph of an exemplary relationship between a cumulative bit count and reference current according to one or more embodiments.
Figure 4:
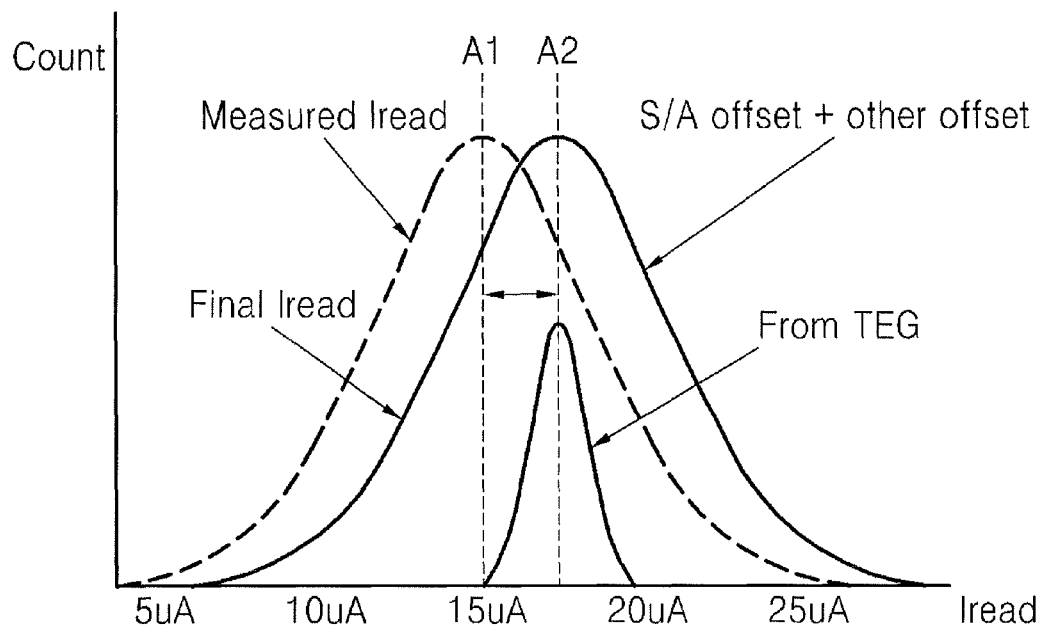
FIG. 4 illustrates a graph of regular distributions of read currents in view of the graph illustrated in FIG. 3.

FIG. 3 illustrates a graph of an exemplary relationship between a cumulative bit count and reference current according to one or more embodiments. FIG. 4 illustrates a graph of regular distributions of read currents in view of the graph illustrated in FIG. 3. Referring to FIGS. 1, 2, 3, and 4, the memory controller 90 may change a level of the reference current Iref and may produce the cumulative distribution graph (FIG. 3) of the memory cells 31 relative to the respective levels of the reference current Iref.

Referring to FIG. 3, in the cumulative distribution graph, the x-axis indicates the level of the reference current Iref and the y-axis indicates a cumulative bit count.

FIG. 4 illustrates a normal distribution graph with respect to the cumulative distribution graph (FIG. 3) of the memory cells. Referring to FIG. 4, an average A1 for reference current measurement is different from an average A2 in test element group (TEG) measurement. This is because the TEG measurement uses AC operation while the reference current measurement uses DC operation and is also because of an offset of the sense amplifier 70.

The memory controller 90 may compare the average A1 in the reference current measurement with the average A2 in the TEG measurement, and may shift a measured current distribution, i.e., Measured head, to a corrected current distribution, i.e., Final Tread, thereby correcting or compensating for the offset.

Figure 5A:
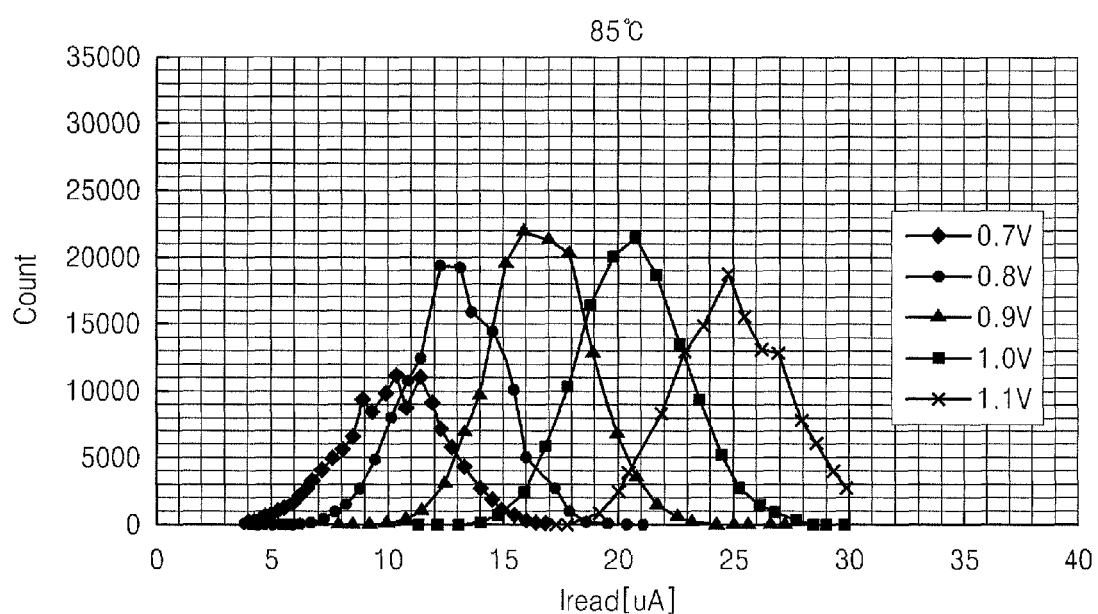
FIG. 5A illustrates a graph of read current distributions measured at a temperature of 85° C.
Figure 5B:
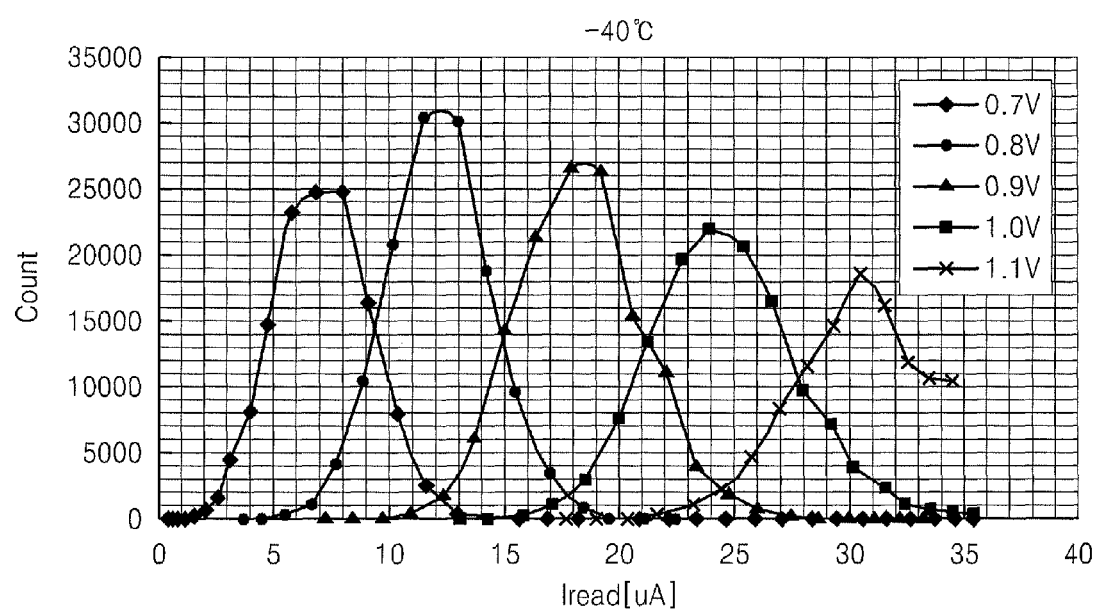
FIG. 5B illustrates a graph of read current distributions measured at a temperature of −40° C.
Figure 6:
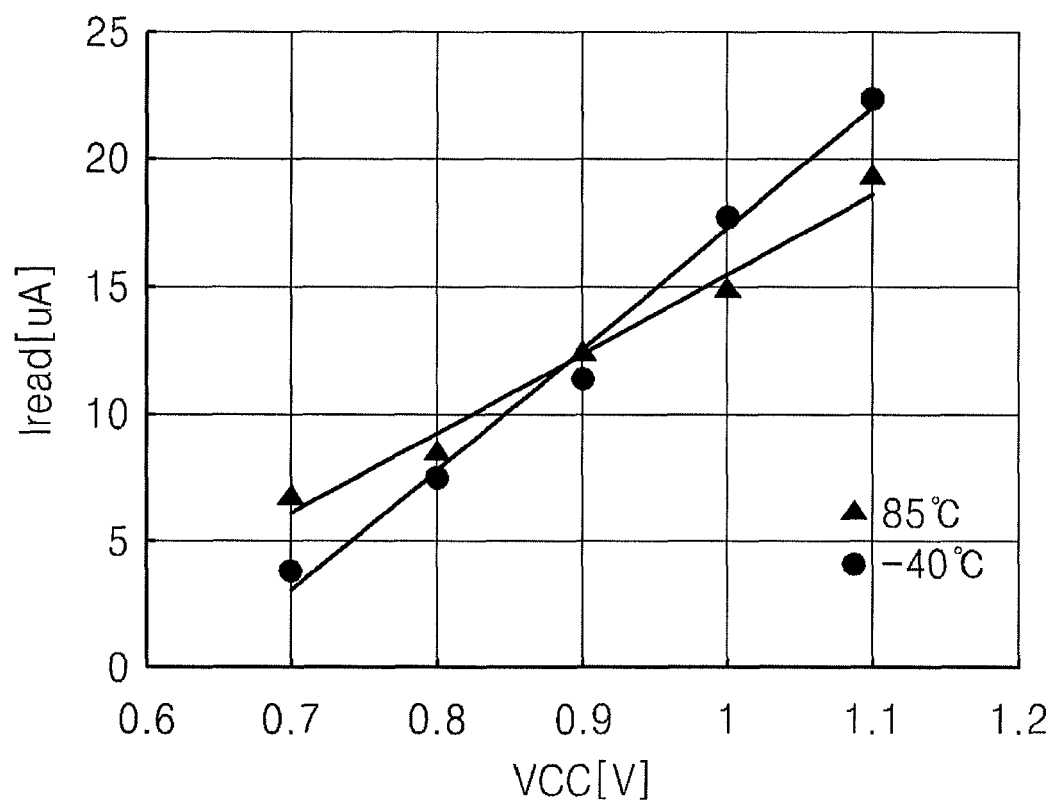
FIG. 6 illustrates a graph of a relationship between measured read current averages relative to supply voltages at temperatures of 85° C. and −40° C.

FIG. 5A illustrates a graph of read current distributions measured at a temperature of 85° C. FIG. 5B illustrates a graph of read current distributions measured at a temperature of −40° C. FIG. 6 illustrates a graph of a relationship between measured read current averages relative to supply voltages at temperatures of 85° C. and −40° C.

More particularly, FIGS. 5A and 5B illustrate the distributions of read currents Iread measured at 128 Kbit SRAM cells in silicon at temperatures of 85° C. and −40° C., respectively. Referring to FIGS. 5 through 6, a temperature inversion point is 0.9 V.

Figure 7:
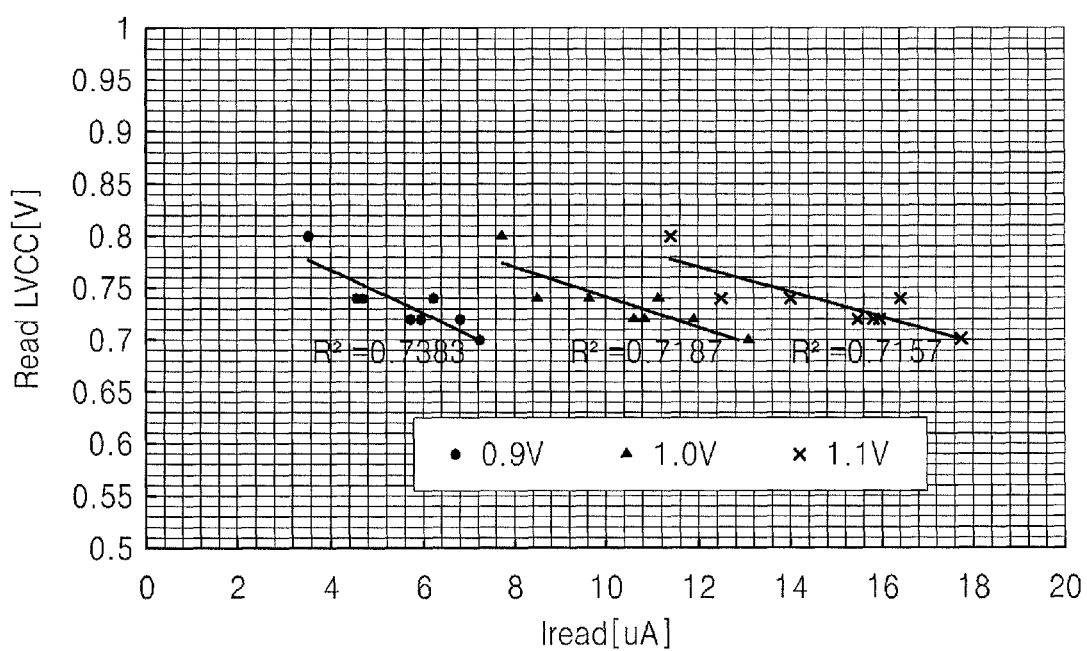
FIG. 7 illustrates a graph of a relationship between distributions of low read voltages relative to read currents.

FIG. 7 illustrates a graph of a relationship between measured distributions of relatively low read voltages Read LVCC relative to read currents Iread. More particularly, FIG. 7 illustrates a graph of the values of the read current Iread at low tail points among the values of the read current Iread measured when each of the supply voltages VCC of 0.9, 1.0, and 1.1 V is applied to nine dies. As shown in FIG. 7, when the read current Tread decreases, the supply voltage VCC increases. Further, it can be inferred from the graph illustrated in FIG. 7 that a low read voltage Read LVCC margin gets worse, e.g., becomes larger, as the read current Iread of a bit cell gets weaker.

Figure 8:
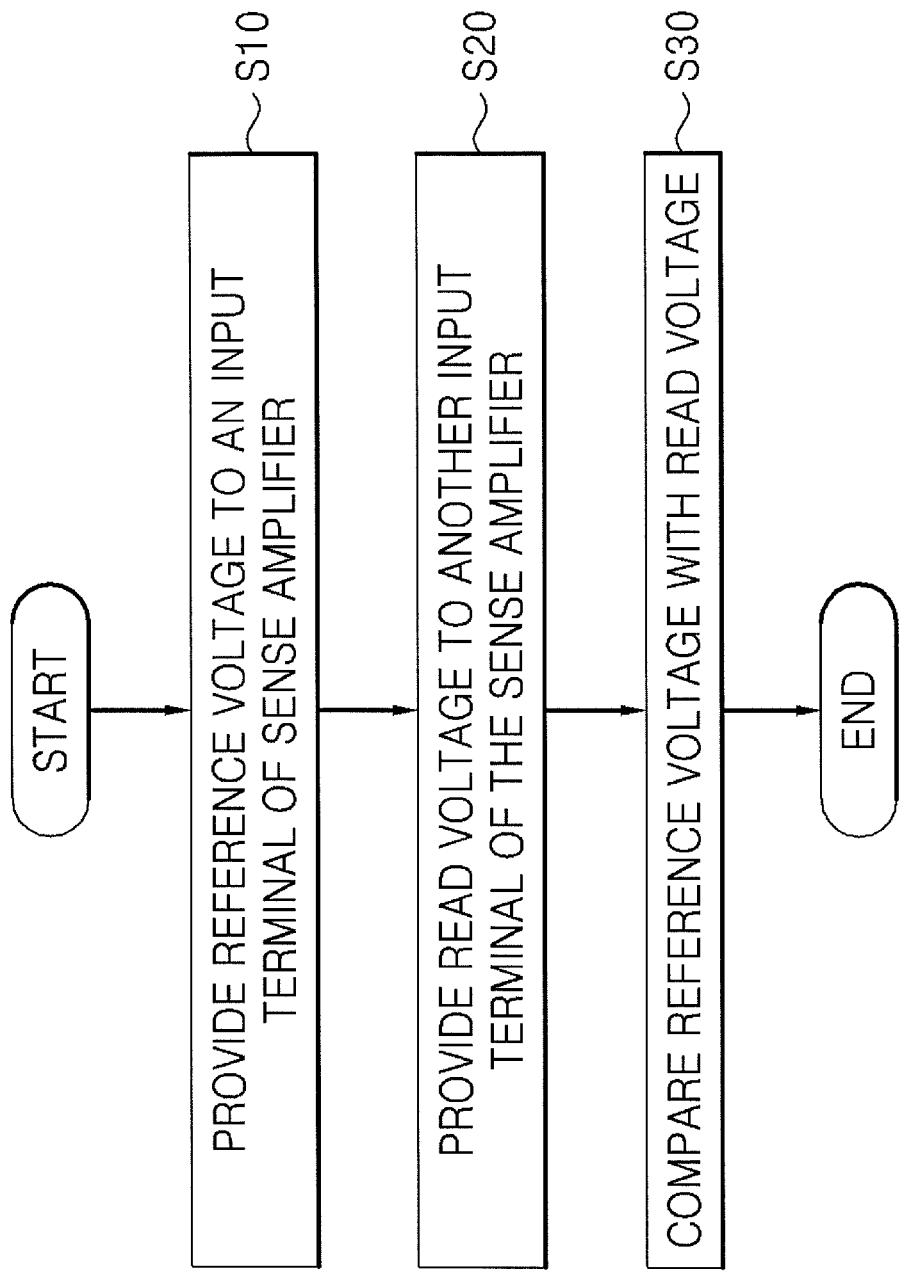
FIG. 8 illustrates a flowchart of an exemplary embodiment of a test operation method of a memory device.

FIG. 8 illustrates a flowchart of an exemplary embodiment of a test operation method of a memory device, e.g., the memory device 20 of FIG. 1. Referring to FIGS. 1 through 8, the reference current generator 41 may generate the reference current Iref and may provide the reference voltage Vrf generated based on the reference current Iref to one of the input terminals DB, nDB of the sense amplifier 70 (S10).

The memory device 20 may provide the read voltage Vrd generated based on the read current Iread of the memory cell 31 to the other of the input terminals DB and nDB of the sense amplifier 70 (S20). The sense amplifier 70 may compare the reference voltage Vrf with the read voltage Vrd (S30). The sense amplifier 70 may count the memory cell 31 when a level of the read current Iread is less than a level of the reference current Iref.

Figure 9:
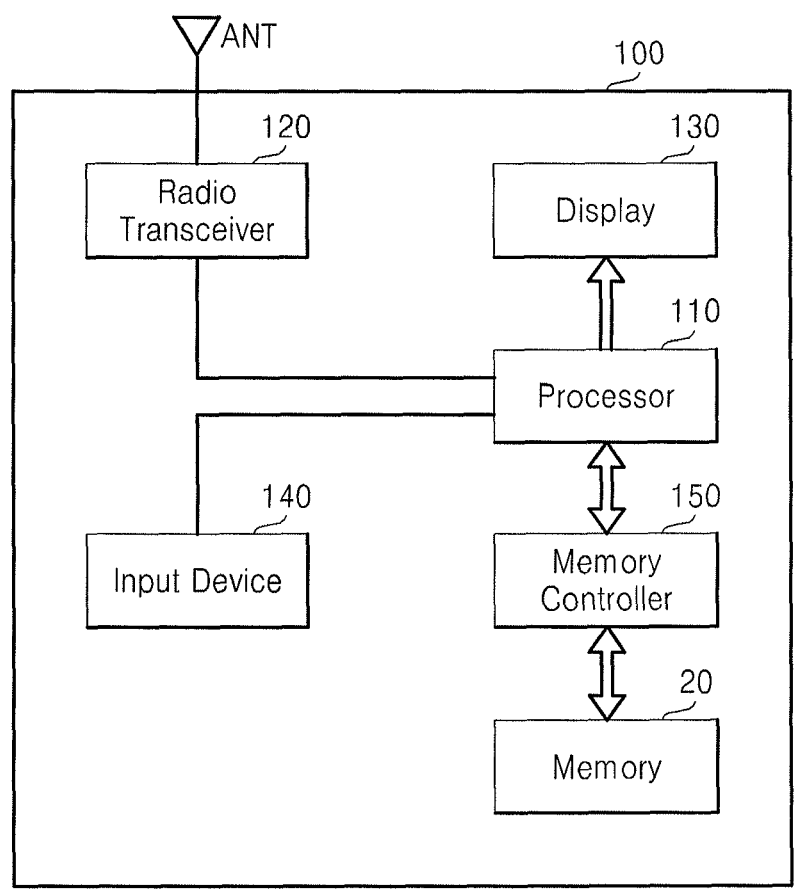
FIG. 9 illustrates a block diagram of an exemplary electronic apparatus including a memory device according to one or more embodiments.

FIG. 9 illustrates a block diagram of an exemplary electronic apparatus 100 including a memory device according to one or more embodiments, e.g., the memory device 20. Referring to FIG. 9, the electronic system 100 may be, e.g., a cellular phone, a smart phone, a tablet personal computer (PC), etc. The electronic system 100 may include the memory device 20, a memory controller 150, an input device 140, a radio transceiver 120, a display 130, and/or a process 110.

The memory controller 150 may control the operations of the memory device 20. The memory device 20 may perform a test operation during which a read current is measured. The memory controller 150 may be the memory controller 90 illustrated in FIG. 1. The processor 110 may control the overall operation of the electronic apparatus 100. For example, the memory controller 150 may be controlled by the processor 110. Data stored in the memory device 20 may be displayed through the display 130 according to the control of the memory controller 150, which may operate according to the control of the processor 110.

The radio transceiver 120 may transmit or receive radio signals through an antenna ANT. The radio transceiver 120 may convert radio signals received through the antenna ANT into signals that can be processed by the processor 110. Accordingly, the processor 110 may process the signals output from the radio transceiver 120, and may store the processed signals in the memory device 20 through the memory controller 150 or display them through the display 130. The radio transceiver 120 may also convert signals output from the processor 110 into radio signals, and may output the radio signals to an external device through the antenna ANT.

The input device 140 may enable control signals for controlling the operation of the processor 110 or data to be processed by the processor 110 to be input to the memory system 100. The input device 140 may be implemented by a pointing device such as a touch pad or a computer mouse, a keypad, or a keyboard. The processor 110 may control the display 130 to display data output from the memory device 20, radio signals output from the radio transceiver 120, and/or data output from the input device 140.

Figure 10:
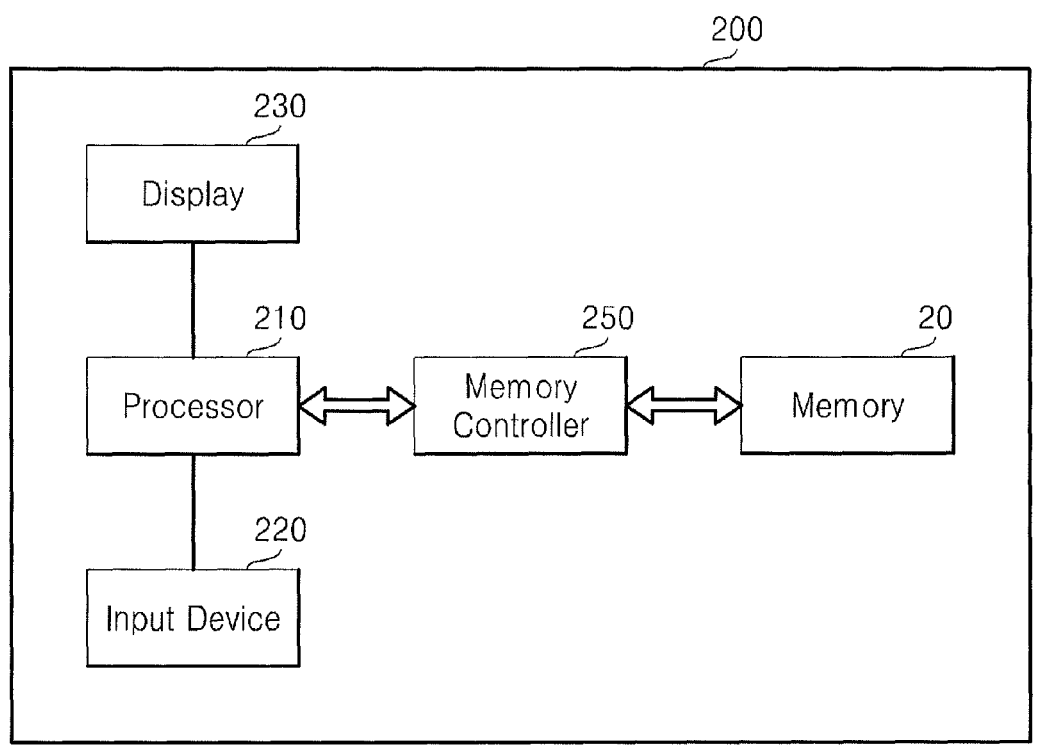
FIG. 10 illustrates a block diagram of an exemplary electronic apparatus including a memory device according to one or more embodiments.

FIG. 10 illustrates a block diagram of an exemplary electronic apparatus including a memory device according to one or more embodiments, e.g., the memory device 20 of FIG. 1. Referring to FIG. 10, the electronic apparatus 200 may be implemented as a data processor such as a PC, a tablet computer, a netbook, an e-reader, a personal digital assistant (PDA), a portable multimedia player (PMP), an MP3 player, an MP4 player, etc. The electronic apparatus 200 may include the memory device 20, a processor 210, an input device 220, a display 230, and a memory controller 250.

The memory controller 250 may control the operations of the memory device 20. The memory controller 250 may correspond to the memory controller 90 shown in FIG. 1. The processor 210 may control the overall operation of the electronic apparatus 200. The memory controller 250 may be controlled by the processor 210. The processor 210 may display data stored in the memory device 20 through a display 230 according to an input signal generated by an input device 220. The input device 220 may be implemented by a pointing device such as a touch pad or a computer mouse, a keypad, a keyboard, etc.

Figure 11:
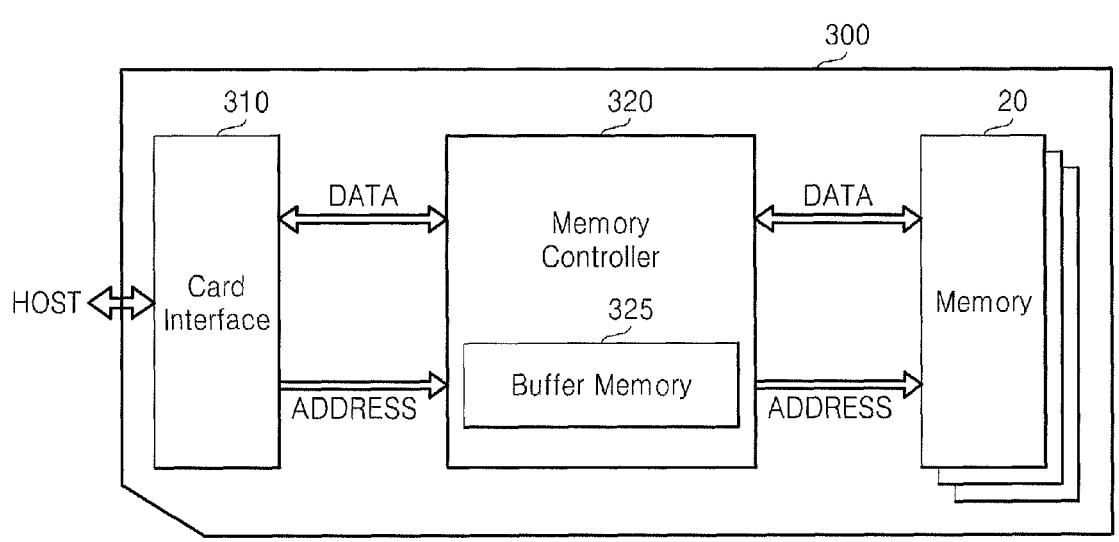
FIG. 11 illustrates a block diagram of an exemplary electronic apparatus including a memory device according to one or more embodiments.

FIG. 11 illustrates a block diagram of an exemplary electronic apparatus 300 including a memory device according to one or more embodiments, e.g., the memory device 20 of FIG. 1. Referring to FIG. 11, the electronic apparatus 300 may include a card interface 310, a memory controller 320, and the memory device 20. The memory device 20 may perform a test operation in which a read current is measured. The memory device may be implemented by volatile or non-volatile memory.

The electronic apparatus 300 may transmit and receive data to and from a host through the card interface 310. The card interface 310 may be a secure digital (SD) card interface, a multi-media card (MMC) interface, etc. The card interface 310 may interface the host and the memory controller 320 for data exchange according to a protocol of the host capable of communicating with the electronic apparatus 300.

The memory controller 320 may control the overall operation of the electronic apparatus 300 and may control data exchange between the card interface 310 and the memory device 20. The memory controller 320 may include a buffer memory 325. The buffer memory 325 may buffer data transferred between the card interface 310 and the memory device 20. The memory controller 320 may be connected to the card interface 310 and the memory device 20 through a data bus DATA and an address bus ADDRESS. The memory controller 320 may receive an address of data to be read or written from the card interface 310, and may transmit the address to the memory device 20 through the address bus ADDRESS.

In addition, the memory controller 320 may receive or transmit data to be read or written through the data bus DATA connected to the card interface 310 or the memory device 20. The memory controller 320 may perform functions the same or similar to those of the memory controller 90 illustrated in FIG. 1. Various types of data may be stored in the memory device 20.

When the electronic apparatus 300 is connected with the host such as a PC, a tablet PC, a digital camera, a digital audio player, a cellular phone, a console video game hardware, a digital set-top box, etc., the host HOST may transmit or receive data to or from the memory device 20 through the card interface 310 and the memory controller 320.

Figure 12:
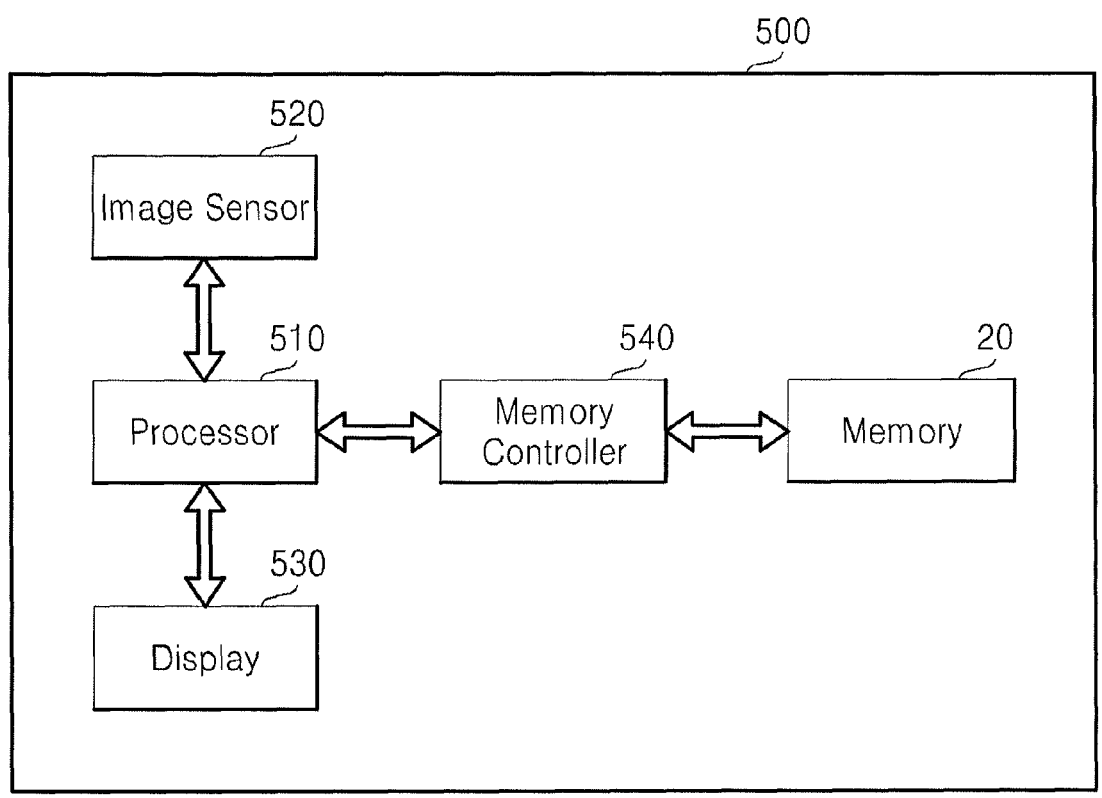
FIG. 12 illustrates a block diagram of an exemplary electronic apparatus including a memory device according to one or more embodiments.

FIG. 12 illustrates a block diagram of an exemplary electronic apparatus 500 including a memory device according to one or more embodiments, e.g., the memory device 20 of FIG. 1. Referring to FIG. 12, the electronic apparatus 500 may include the memory device 20, a processor 510, an image sensor 520, a display 530, and a memory controller 540. The memory controller 540 may control the data processing operation of the memory device 20. The processor 510 may control the overall operation of the electronic apparatus 500.

The image sensor 520 may convert optical signals into digital signals. The digital signals may be stored in the memory device 20 or displayed through a display 530 under the control of the processor 510. The digital signals stored in the memory device 20 may be displayed through the display 530 under the control of the processor 510. The memory device 20 may measure a read current. The memory device 20 may be implemented by a volatile or non-volatile memory.

Figure 13:
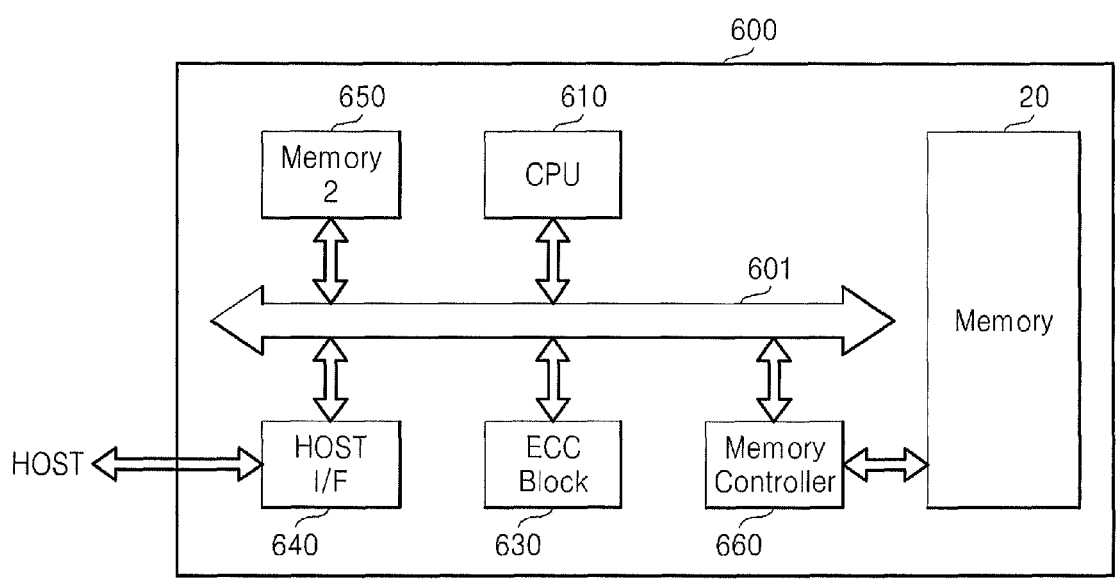
FIG. 13 illustrates a block diagram of an exemplary electronic apparatus including a memory device according to one or more embodiments.

FIG. 13 illustrates a block diagram of an exemplary electronic apparatus 60 including a memory device according to one or more embodiments, e.g., the memory device 20 of FIG. 1. Referring to FIG. 13, the electronic apparatus 600 may include the memory device 20, a bus 601, a central processing unit (CPU) 610, an error correction code (ECC) block 630, a host interface 640, and a memory 650.

The memory controller 660 may control operations of the memory device 20. The CPU 610 may control overall operation of the electronic apparatus 600.

The memory 650 may be used an operation memory of the CPU 610. The memory 650 may be implemented by memory like read-only memory (ROM) or a volatile memory like dynamic random access memory (DRAM). A host connected with the electronic apparatus 600 may transmit or receive data to or from the memory device 20 through the memory controller 660 and the host interface 640. At this time, the memory controller 660 may function as a memory interface.

The ECC block 630 may operate according to the control of the CPU 610 to detect, and may correct an error bit included in data read from the memory device 20 through the memory controller 660. The memory device 20 may perform a test operation of measuring a read current.

The CPU 610 may control data exchange among the memory controller 660, the ECC block 630, the host interface 640, and the memory 650 through the bus 601. The electronic apparatus 600 may be implemented as a universal serial bus (USB) memory drive or a memory stick.

Figure 14:
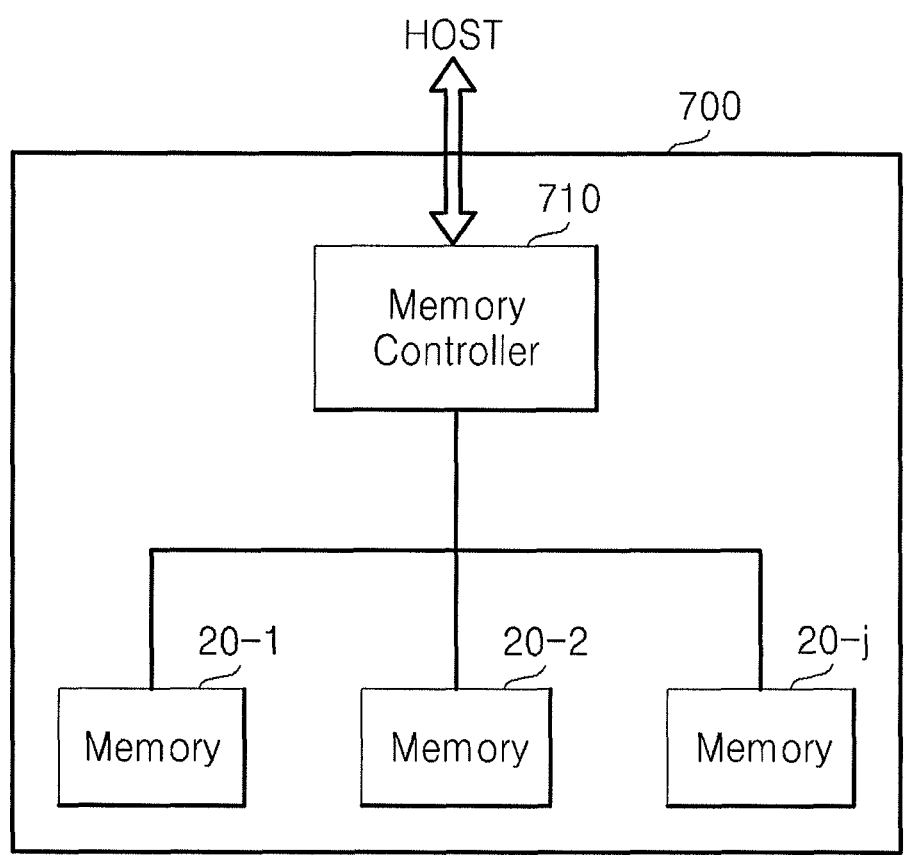
FIG. 14 illustrates a block diagram of an exemplary electronic apparatus including a memory device according to one or more embodiments.

FIG. 14 illustrates a block diagram of an exemplary electronic apparatus 700 including a memory device according to one or more embodiments, e.g., the memory device 20 of FIG. 1. Referring to FIG. 14, the electronic apparatus 700 may be implemented as a data storage system like a solid state drive (SSD).

The electronic apparatus 700 may include a plurality of memory devices 20-1 through 20-j and a memory controller 710. The memory controller may control the data processing operations of the memory devices 20-1 through 20-j. The memory devices 20-1 through 20-j may perform a test operation of measuring a read current. The electronic apparatus 700 may be implemented as a memory system or a memory module. The memory controller 710 may be implemented inside or outside the electronic apparatus 700.

Figure 15:
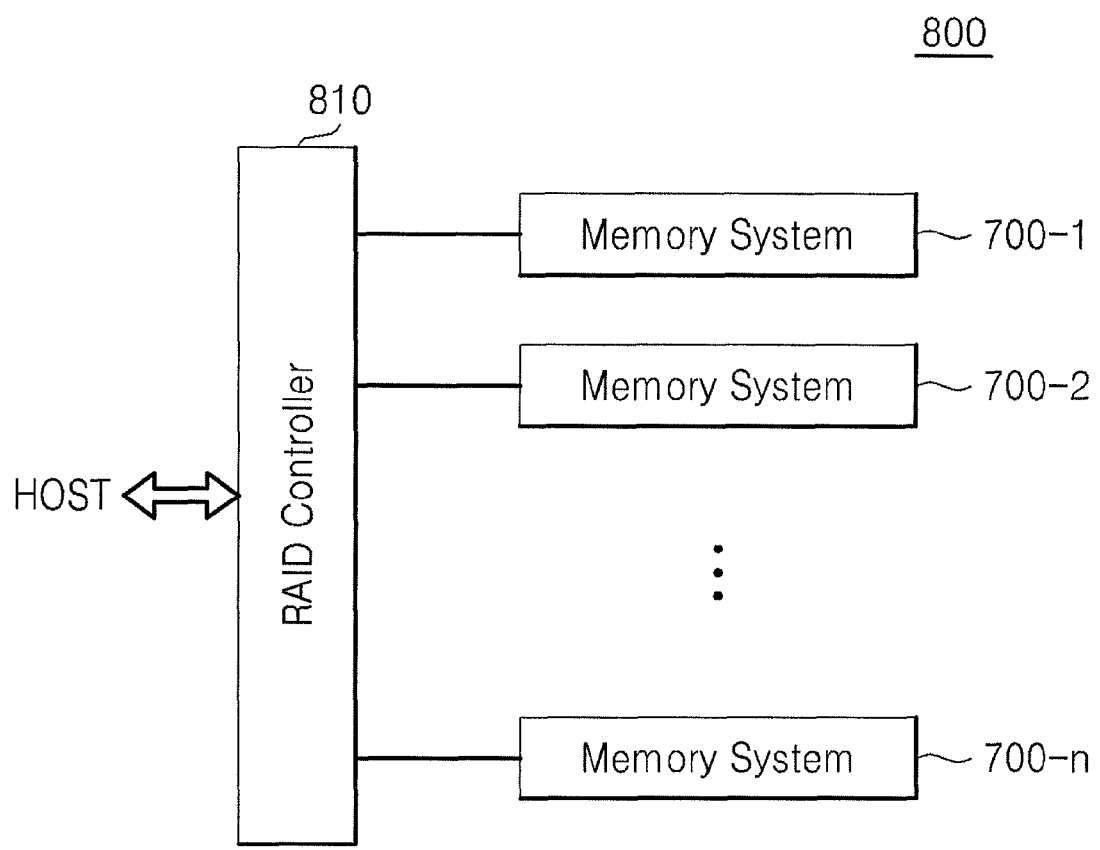
FIG. 15 illustrates a block diagram of a data processing system including the electronic apparatus illustrated in FIG. 14.

FIG. 15 illustrates a block diagram of a data processing system 800 including the electronic apparatus 700 illustrated in FIG. 14. Referring to FIGS. 14 and 15, the data processing system 800 may be implemented by a redundant array of independent disks (RAID) system. The data processing system 800 may include a RAID controller 810 and a plurality of memory systems 700-1 through 700-n, where "n" is a natural number.

Each of the memory systems 700-1 through 700-n may be the electronic apparatus 700 illustrated in FIG. 14. The memory systems 700-1 through 700-n may form a RAID array. The data processing system 800 may be implemented as a PC or an SSD.

One or more embodiments may provide a memory device including a circuit for measuring a read current of a memory cell that is configured to perform quick and accurate weak cell fail analysis, achieve fast yield ramp at an early stage of a process, and improve process monitoring in mass production.

While the inventive concept has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A test operation method of a memory device, the test operation method comprising:
generating, by a reference current generator, a reference current and providing a reference voltage generated based on the reference current to a first input terminal of a sense amplifier;
providing a read voltage generated based on a read current of a memory cell to a second input terminal of the sense amplifier; and
comparing, by the sense amplifier, the reference voltage with the read voltage,
wherein, when a level of the read current is less than a level of the reference current, the method further includes counting, by the sense amplifier, the memory cell.

2. A test operation method of a memory device, the test operation method comprising:
generating, by a reference current generator, a reference current and providing a reference voltage generated based on the reference current to a first input terminal of a sense amplifier;
providing a read voltage generated based on a read current of a memory cell to a second input terminal of the sense amplifier; and
comparing, by the sense amplifier, the reference voltage with the read voltage, wherein the method further comprises:
changing a level of the reference current and generating a distribution graph of a plurality of memory cells with respect to the levels of the reference current;
comparing the distribution graph of the memory cells with respect to the levels of the reference current with a memory cell distribution graph produced using a test element group (TEG); and
compensating for an offset of the distribution graph of the memory cells with respect to the level of the reference current.

3. A memory system, comprising:
a memory device; and
a processor configured to control the memory device,
wherein the memory device includes:
a memory cell connected to a word line and a plurality of bit lines;
a reference current generator configured to generate a reference current; and
a sense amplifier configured to perform a test operation by comparing a read voltage generated based on a read current of the memory cell with a reference voltage generated based on the reference current, and
wherein, when the read current is less than the reference current, the sense amplifier counts the memory cell.

4. The memory system as claimed in claim 3, wherein the memory device further comprises a bit line load circuit configured to function as an active resistor to generate the read voltage.

5. The memory system as claimed in claim 3, wherein the memory device further comprises:
a plurality of column switches respectively connected in series with the plurality of bit lines; and
a plurality of sense amplifier switches respective one ends of which are connected to an output terminal of the reference current generator and respective other ends of which are connected to input terminals, respectively, of the sense amplifier.

6. A memory system, comprising:
a memory device; and
a processor configured to control the memory device,
wherein the memory device includes:
a memory cell connected to a word line and a plurality of bit lines;
a reference current generator configured to generate a reference current; and
a sense amplifier configured to perform a test operation by comparing a read voltage generated based on a read current of the memory cell with a reference voltage generated based on the reference current, and
wherein the reference current generator comprises:
a reference voltage pin configured to receive a reference pin voltage and change a level of the reference current; and
a reference current pin connected to a test probe to monitor the level of the reference current.

7. A memory device, comprising:
a plurality of memory cells;
a sense amplifier;

a reference current generator including a plurality of transistors coupled in series between a reference current pin and a ground supply; and a bit line load circuit configured to function as an active resistor to generate the read voltage, wherein:

at least one of the transistors is controlled by a reference voltage pin, the reference current generator is configured to generate a reference current, and to provide a reference voltage generated based on the reference current to the sense amplifier, wherein the sense amplifier is configured to compare the reference voltage with a read voltage generated based on a read current of a respective one of the memory cells, and wherein the bit line load circuit includes a plurality of transistors and each of the plurality of memory cells includes a plurality of transistors and corresponding ones of the plurality of transistors of the memory cells and the bit line load circuit are coupled in series between a supply voltage and a ground supply, and electrical characteristics of the plurality of the corresponding ones of the transistors of the memory cells and the bit line load circuit that are coupled in series are same as electrical characteristics of the plurality of transistors of the reference current generator coupled in series.

8. The memory device as claimed in claim 7, wherein a level of the reference current is changed in accordance with a signal supplied by the reference voltage pin.

9. The memory device as claimed in claim 7, further including a control circuit configured to generate load enable signals, read mux signals, and sense amplifier control signals.

* * * * *